US 6,723,623 B1

(12) United States Patent
Nguyen

(10) Patent No.: US 6,723,623 B1
(45) Date of Patent: Apr. 20, 2004

(54) METHODS OF FORMING IMPLANT REGIONS RELATIVE TO TRANSISTOR GATES

(75) Inventor: Phong N. Nguyen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/326,725

(22) Filed: Dec. 20, 2002

(51) Int. Cl.$^7$ .............................................. H01L 21/425
(52) U.S. Cl. ........................ 438/525; 438/142; 438/279; 438/302; 438/689
(58) Field of Search ................................ 438/142, 157, 438/174, 279, 302, 369, 373, 524, 519, 525, 689

(56) References Cited

U.S. PATENT DOCUMENTS 6,555,454 B2 * 4/2003 Park ........................... 438/584
6,593,202 B2 * 7/2003 Hosotani et al. ............ 438/381
6,607,955 B2 * 8/2003 Lee ............................. 438/256

* cited by examiner

Primary Examiner—Kamand Cuneo
Assistant Examiner—Asok Kumar Sarkar
(74) Attorney, Agent, or Firm—Wells St. John P.S.

(57) ABSTRACT

The invention includes methods of forming implant regions between and/or under transistor gates. In one aspect, a pair of transistor gates is partially formed, and a layer of conductive material is left extending between the transistor gates. A dopent is implanted through the conductive material to form at least one implant region between and/or beneath the partially formed transistor gates, and subsequently the conductive material is removed from between the gates. The gates can be incorporated into various semiconductor assemblies, including, for example, DRAM assemblies.

61 Claims, 7 Drawing Sheets

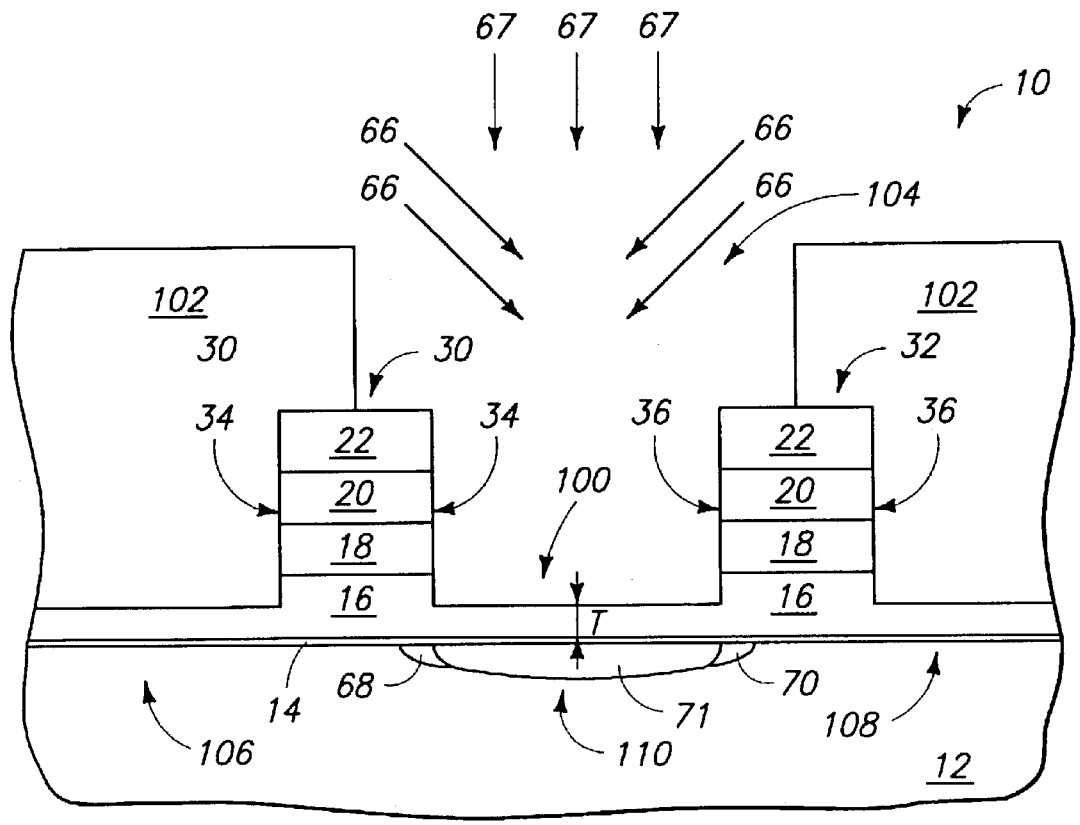
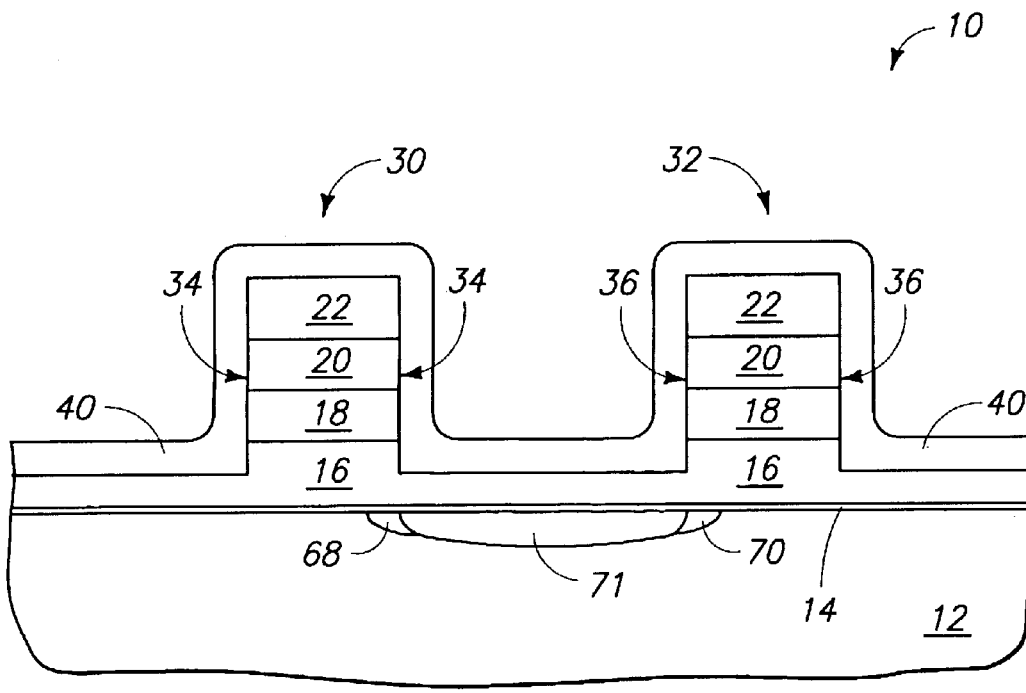

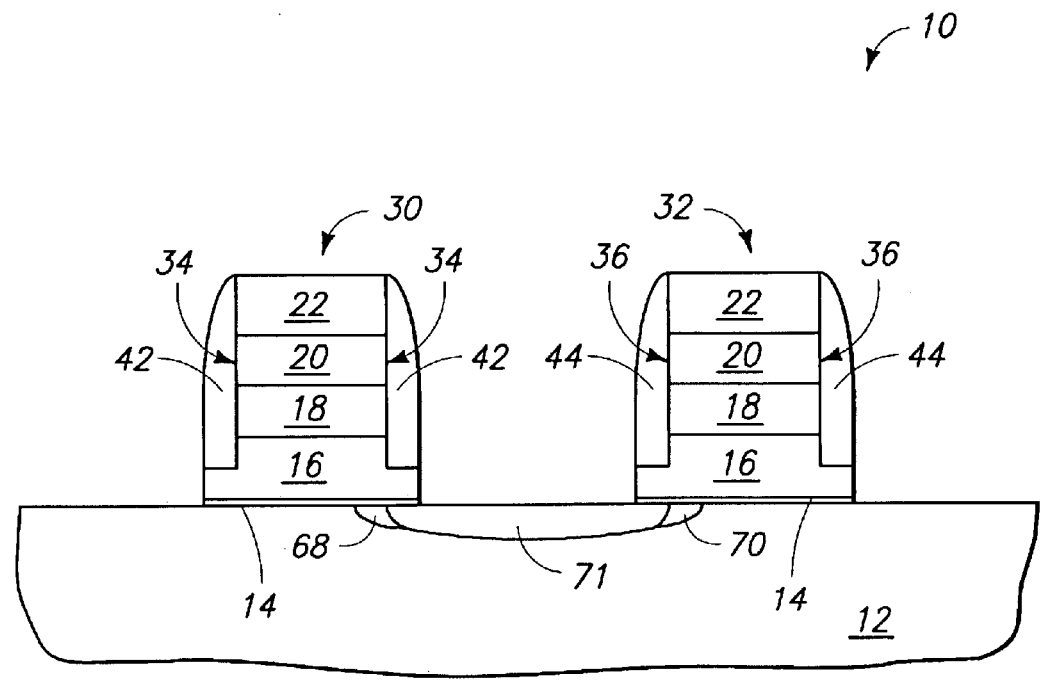
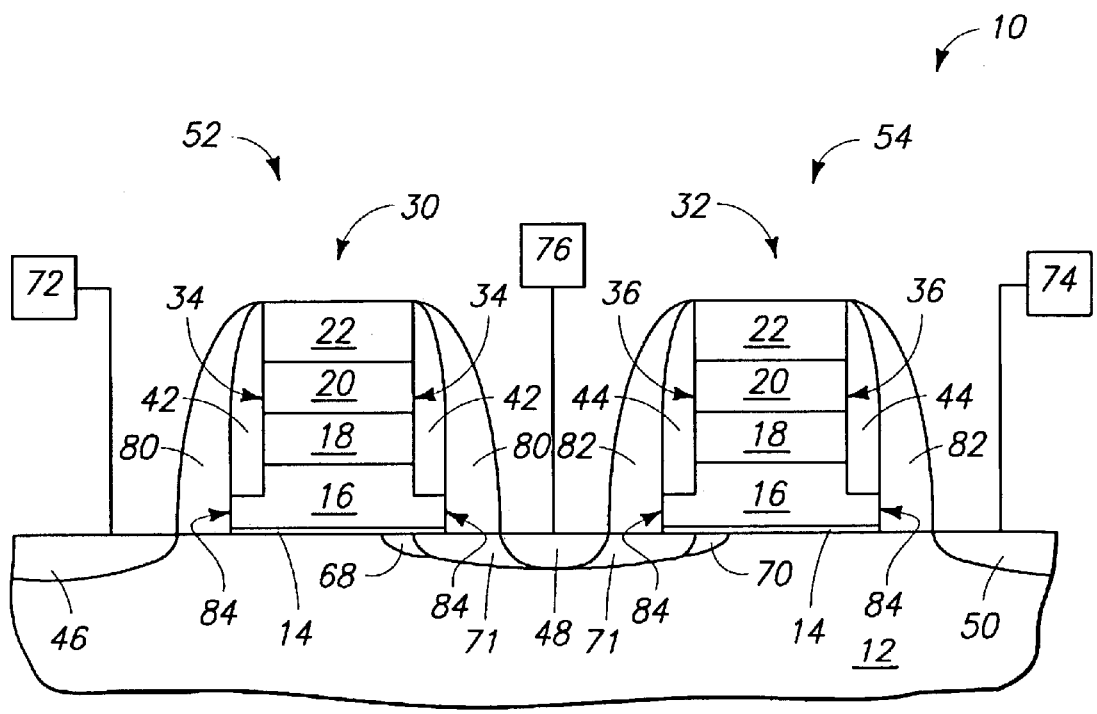

US 6,723,623 B1

METHODS OF FORMING IMPLANT REGIONS RELATIVE TO TRANSISTOR GATES

TECHNICAL FIELD

The invention pertains to methods of forming implant regions. In particular aspects, the invention pertains to methods of forming pocket implant regions and/or an $L_{DD}$ region for a bitline contact source/drain region shared between a pair of adjacent transistor gates.

BACKGROUND OF THE INVENTION

Dynamic Random Access Memory (DRAM) arrays are commonly utilized semiconductor constructions. The arrays typically comprise large numbers of individual DRAM cells, with each cell typically containing a capacitor for data storage. Each capacitor is electrically connected to a source/drain region of a transistor, with the transistor gate typically being part of a wordline. A bitline is electrically connected to another source/drain region of the transistor, and the transistor gatedly connects the bitline with the capacitor.

It is common for a pair of adjacent DRAM cells to share a bitline connection. A transistor associated with one DRAM cell has a source/drain region which overlaps the source/drain region of an adjacent transistor associated with a second DRAM cell. The overlapping source/drain region is in electrical connection with a bitline contact, and accordingly the bitline contact is shared between the adjacent DRAM cells.

Exemplary processing for forming a pair of adjacent DRAM cells is described with reference to FIGS. 1–6.

Referring initially to FIG. 1, a semiconductor construction 10 is illustrated at a preliminary processing stage. Construction 10 comprises a substrate 12 having an insulative material 14 formed thereover. Substrate 12 can comprise, consist essentially of, or consist of a single crystal semiconductive material (such as, for example, monocrystalline silicon) lightly doped with an appropriate dopant (such as, for example, a p-type dopant). For instance, substrate 12 can be a monocrystalline silicon wafer background doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone, or in assemblies comprising other materials). The term "substrate" refers to any supporting structure, including, but not limited to, the semiconductive substrates described above. Also to aid in interpretation of this disclosure and the claims that follow, the terms "insulative" and "conductive" are to be understood to refer to electrically insulative and electrically conductive materials, respectively.

Insulative material 14 can comprise, for example, silicon dioxide, and can ultimately be utilized to form a so-called pad oxide layer for transistor gates.

A conductive material 16 is formed over insulative layer 14. Conductive material 16 can comprise, consist essentially of, or consist of, for example, conductively-doped silicon, such as, for example, conductively-doped polycrystalline silicon. If conductive material 16 comprises conductively-doped silicon, the dopant can be either n-type or p-type dopant, and in typical applications of forming DRAM arrays will be n-type dopant.

Conductive layers 18 and 20 are formed over conductive material 16. Conductive layers 18 and 20 can comprise, consist essentially of, or consist of metal and/or metal compounds. In an exemplary construction, layer 18 will comprise, consist essentially of, or consist of tungsten nitride; and layer 20 will comprise, consist essentially of, or consist of tungsten.

An insulative cap 22 is formed over conductive material 20. Insulative cap 22 can comprise any suitable electrically insulative material, including, for example, silicon nitride; and in particular applications will consist of silicon nitride.

Layers 14, 16, 18, 20 and 22 can collectively be referred to as a gate stack 24. It is noted that the shown gate stack is but one exemplary type of gate stack and that numerous other types of gate stacks can be utilized in forming transistor constructions. For instance, insulative material 14 can optionally not be considered part of the gate stack. Alternatively, insulative material 14 can be considered part of the gate stack and can comprise several layers of insulative materials. Also, even though three separate conductive layers are shown (16, 18 and 20) it is to be understood that more than three separate conductive layers can be utilized, or in other applications less than three separate conductive layers can be utilized. In the shown construction, typical thicknesses of layers 14, 16, 18, 20 and 22 are about 70 Angstroms, about 500 Angstroms, about 100 Angstroms, about 200 Angstroms, and about 1500 Angstroms, respectively. The drawings are utilized to illustrate respective orientations of the shown layers, and are diagrammatic illustrations only. Accordingly, respective thicknesses of the various layers are not shown to scale.

A patterned mask 26 is formed over insulative material 22. Mask 26 can comprise, for example, photoresist, and is utilized to define locations of transistor gates. If mask 26 comprises photoresist, such can be patterned utilizing photolithographic methods.

Referring to FIG. 2, a pattern is transferred from mask 26 (FIG. 1) to underlying layers 16, 18, 20 and 22 to define a pair of partially-formed transistor gates 30 and 32; and the mask is subsequently removed. The transfer of a pattern from the mask to the underlying layers can be accomplished utilizing a suitable etch. It is noted that the etch has only proceeded partially through conductive material 16, and thus leaves an unetched portion of material 16 remaining over layer 14, in addition to forming an etched portion of material 16.

The partially-formed transistor gates 30 and 32 have sidewalls 34 and 36, respectively. An opposing pair of sidewalls is associated with each transistor gate.

Referring to FIG. 3, an insulative material 40 is formed over the unetched portion of conductive material 16, as well as along the sidewalls 34 and 36 of partially-formed transistor gates 30 and 32. Additionally, insulative material 40 extends over tops of the partially-formed transistor gates 30 and 32. Insulative material 40 can comprise any suitable material, and, in exemplary applications, comprises, consists essentially of, or consists of silicon nitride.

Referring to FIG. 4, layer 40 is anisotropically etched to form sidewall spacers 42 and 44 along the sidewalls 34 and 36, respectively. After formation of spacers 42 and 44, an etch is utilized to extend the opening through the remaining portion of conductive material 16, as well as through insulative material 14. The etch completes formation of transistor gates 30 and 32, and exposes a surface of substrate 12 between the transistor gates. It is to be understood, however, that in other processing (not shown) the opening can be extended through the remaining portion of conductive material 16, but not through insulative material 14; and accordingly material 14 can be left over an upper surface of substrate 12 after the etch.

In applications in which insulative cap 22 consists of silicon nitride, sidewall spacers 42 and 44 consist of silicon nitride, and in which conductive material 16 consists of conductively-doped silicon, a suitable etch for conductive material 16 is an etch selective for conductively-doped silicon relative to silicon nitride.

After etching through the remaining portion of conductive material 16, source/drain regions 46, 48 and 50 can be formed proximate the transistor gates utilizing an appropriate implant. For instance, the source/drain regions can be heavily-doped n-type regions, and accordingly can be formed utilizing a suitable implant of n-type dopant. As shown, the regions are self-aligned relative to transistor gates 30 and 32 since the transistor gates 30 and 32 are effectively utilized as a mask during the formation of the source/drain regions.

A first transistor device 52 can be considered to comprise transistor gate 30 in combination with source/drain regions 46 and 48; and a second transistor device 54 can be considered to comprise transistor gate 32 together with source/drain regions 48 and 50. Accordingly, source/drain region 48 is shared by the first and second transistor devices 52 and 54.

A masking material 60 is formed over transistor devices 52 and 54. Masking material 60 can comprise, for example, photoresist.

Referring to FIG. 5, masking material 60 is patterned to form an opening 62 extending to shared source/drain region 48. If masking material 60 comprises photoresist, opening 62 can be formed utilizing photolithographic processing methods.

A problem which can occur during formation of opening 62 through the large amount of photoresist material 60 is that a small amount of photoresist material can remain at the bottom of the opening as a so-called scum 64. The amount of photoresist material remaining at the bottom of the opening is variable. In typical processing, an array of devices will be formed. Accordingly, the two devices shown being patterned would correspond to a small portion of a large array of devices, with such array typically comprising thousands of devices, and accordingly thousands of openings would be formed between the devices. The variable amount of scum 64 within the various openings can complicate subsequent procedures, in that it can lead to non-uniformity of the procedures across the various openings.

A dopant 66 is implanted at an angle into substrate 12 to form pocket implant regions 68 and 70 relative to the transistor devices 52 and 54, respectively. Implant 66 is referred to as an "angled" implant, to emphasize that the implant is at an angle other than 0° relative to a vertical direction. In the diagram of FIG. 5, an axis 68 is provided to illustrate a vertical direction (such direction is substantially orthogonal to a substantially planar upper surface of substrate 12), and an angle θ is provided to shown the relative angle of implant 66 to the vertical direction. Angle θ has an absolute magnitude greater than 0°.

Dopant 66 can be either a p-type dopant or an n-type dopant, and can be of the same conductivity type as the dopant utilized for forming heavily-doped source/drain region 48 or of an opposite dopant type. In exemplary processing, dopant 66 will be of an opposite dopant type to the dopant utilized for forming source/drain region 48, and accordingly pocket implant region 68 and 70 can be halo regions relative to heavily-doped source/drain region 48. The pocket implant regions can comprise a lower concentration of dopant than the heavily-doped regions. For instance, the heavily-doped regions can comprise at least about $10^{21}$ atoms/cm$^3$ of dopant and the pocket implant regions can comprise from about $10^{19}$ atoms/cm$^3$ to about $5 \times 10^{20}$ atoms/cm$^3$.

An additional implant which can be performed at the processing stage of FIG. 5 is a lightly doped diffusion ($L_{DD}$) implant. The $L_{DD}$ implant is typically straight into substrate 12 (i.e., implanted with angle θ of 0 degrees), and forms a region overlapping region 48. The dopant of the $L_{DD}$ implant can subsequently be diffused to extend outwardly beyond region 48. The $L_{DD}$ implant is not shown in FIG. 5. The $L_{DD}$ region would typically formed to have a dopant concentration of from about $10^{19}$ atoms/cm$^3$ to about $5 \times 10^{20}$ atoms/cm$^3$.

Problems which can occur during the processing of FIG. 5 are that the variable thickness of scum 64 amongst various openings of an array can cause implant regions 68 and 70 to have different depths across the array, and can also cause $L_{DD}$ implant regions to have different depths across the array. The differing depths of the $L_{DD}$ implant region and of regions 68 and 70 can undesirably create variances in device performance across the array.

Referring to FIG. 6, mask 60 and scum 64 (FIG. 5) are stripped from construction 10 and ultimately transistor devices 52 and 54 are incorporated into a pair of DRAM cells. Specifically, source/drain regions 46 and 50 are electrically connected to storage nodes of capacitor constructions 72 and 74, respectively, and source/drain region 48 is electrically connected to a bitline 76. In the shown exemplary construction, spacers 80 and 82 have been formed outwardly of spacers 42 and 44 to cover exposed conductive surfaces 84 of conductive material 16. Spacers 80 and 82 can comprise any suitable insulative material, and can, in particular aspects, consist of one or both of silicon dioxide and silicon nitride. Spacers 80 can be formed by providing one or more layers of insulative material over substrate 12 and transistor gates 30 and 32, and subsequently anisotropically etching the insulative material. It is noted that although heavily doped source/drain regions 46, 48 and 50 are shown formed before spacers 80 and 82, the heavily doped source/drain regions can alternatively be implanted after the formation of spacers 80 and 82.

The construction of FIG. 6 can be considered to comprise a pair of DRAM cells. Specifically, a first DRAM cell can be considered to include first transistor device 52 together with capacitor 72, and a second DRAM cell can be considered to comprise second transistor 54 in combination with capacitor 74.

SUMMARY OF THE INVENTION

The invention includes methods of forming implant regions relative to transistor gates. In one aspect, a pair of transistor gates is partially formed, and a layer of conductive material is left extending between the transistor gates. A dopant is implanted through the conductive material to form one or more implant regions beneath and/or between the partially formed transistor gates, and subsequently the conductive material is removed from between the gates. The one or more implant regions can correspond to pocket implant regions and/or to an $L_{DD}$ region. The gates can be incorporated into various semiconductor assemblies, including, for example, DRAM assemblies. In a particular application, the gates are incorporated into a pair of adjacent DRAM cells, with the adjacent DRAM cells sharing a bitline contact.

BRIEF DESCRIPTION OF THE DRAWINGS

Preferred embodiments of the invention are described below with reference to the following accompanying drawings.

FIG. 7 is a view of the FIG. 1 fragment shown at a processing stage subsequent to that of FIG. 2 in accordance with an exemplary aspect of the present invention.

FIG. 8 is a view of the FIG. 7 fragment shown at a processing state subsequent to that of FIG. 7.

FIG. 9 is a view of the FIG. 7 fragment shown at a processing stage subsequent to that of FIG. 8.

FIG. 10 is a view of the FIG. 7 fragment shown at a processing stage subsequent to that of FIG. 9.

DETAILED DESCRIPTION OF THE PREFERRED EMBODIMENTS

An exemplary aspect of the invention is described with reference to FIGS. 7–10. In referring to FIGS. 7–10, similar numbering will be used as was utilized above in describing the prior art methodology of FIGS. 1–6, where appropriate.

Figure 1:
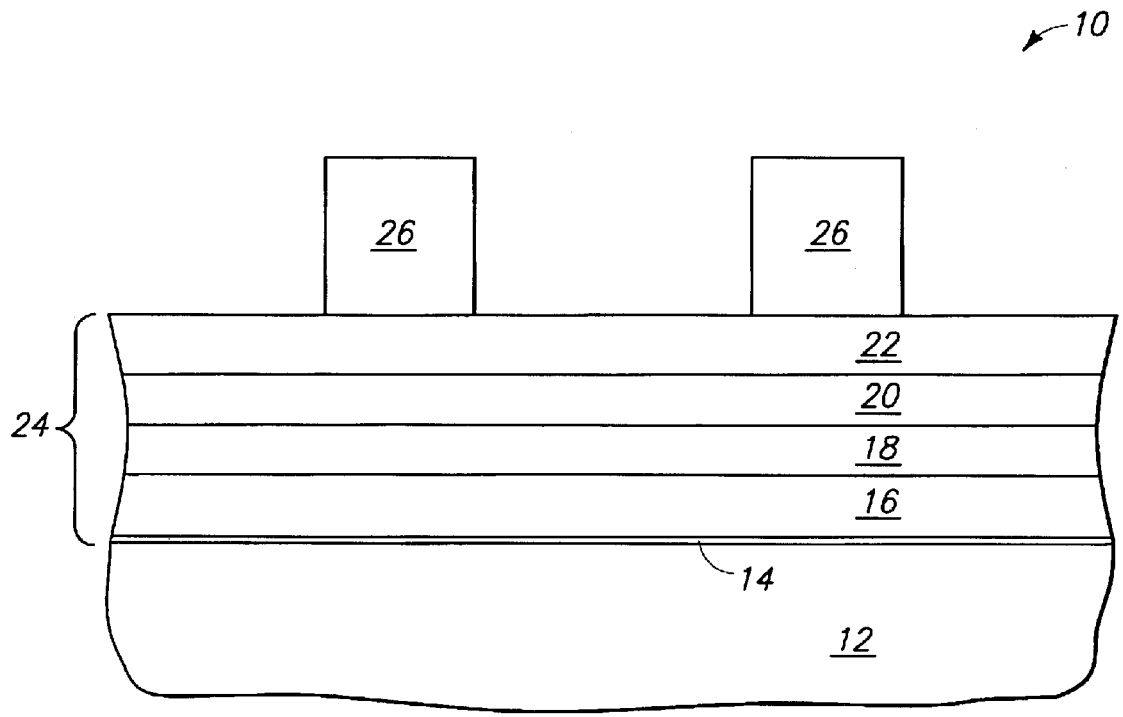
FIG. 1 is a diagrammatic, cross-sectional view of a semiconductor wafer fragment at a preliminary processing stage of a prior art method.
Figure 2:
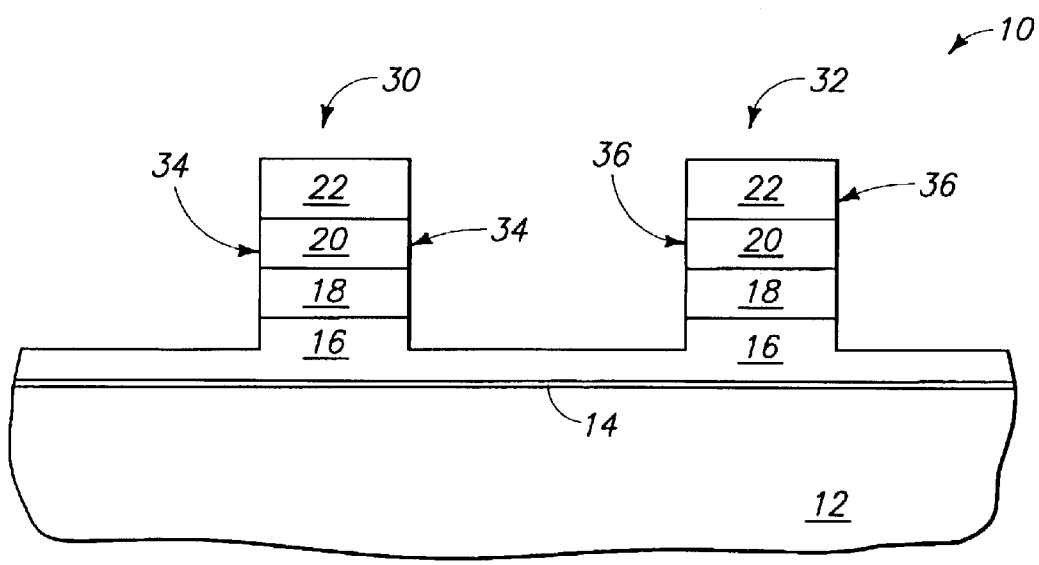
FIG. 2 is a view of the FIG. 1 fragment shown at a prior art processing stage subsequent to that of FIG. 1.
Figure 3:
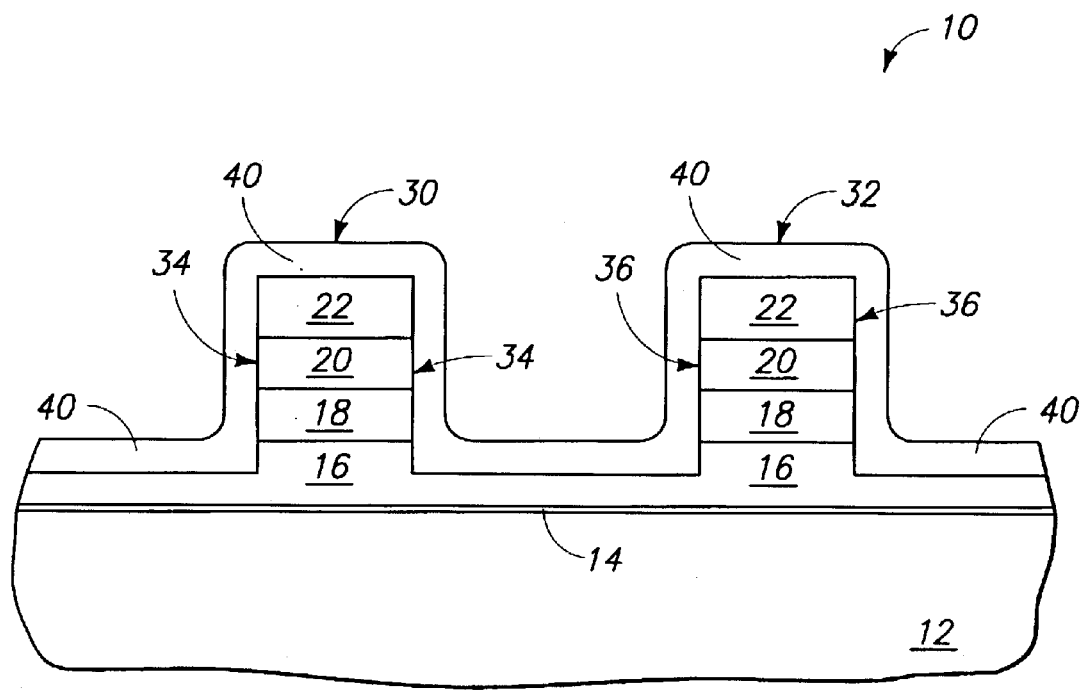
FIG. 3 is a view of the FIG. 1 fragment shown at a prior art processing stage subsequent to that of FIG. 2.
Figure 4:
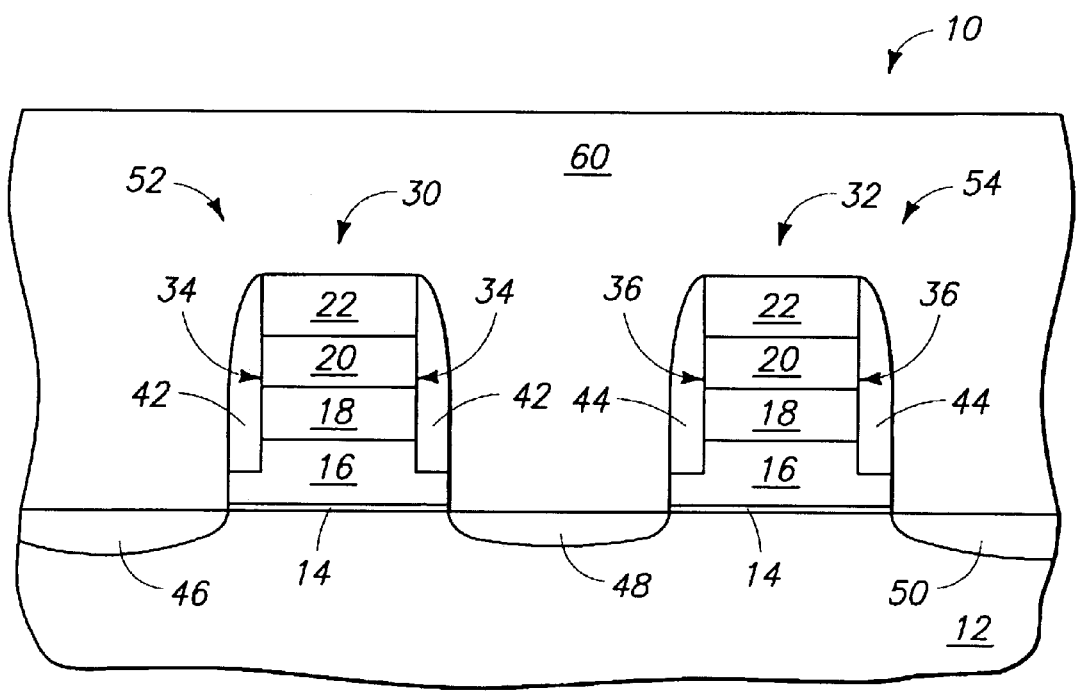
FIG. 4 is a view of the FIG. 1 fragment shown at a prior art processing stage subsequent to that of FIG. 3.
Figure 5:
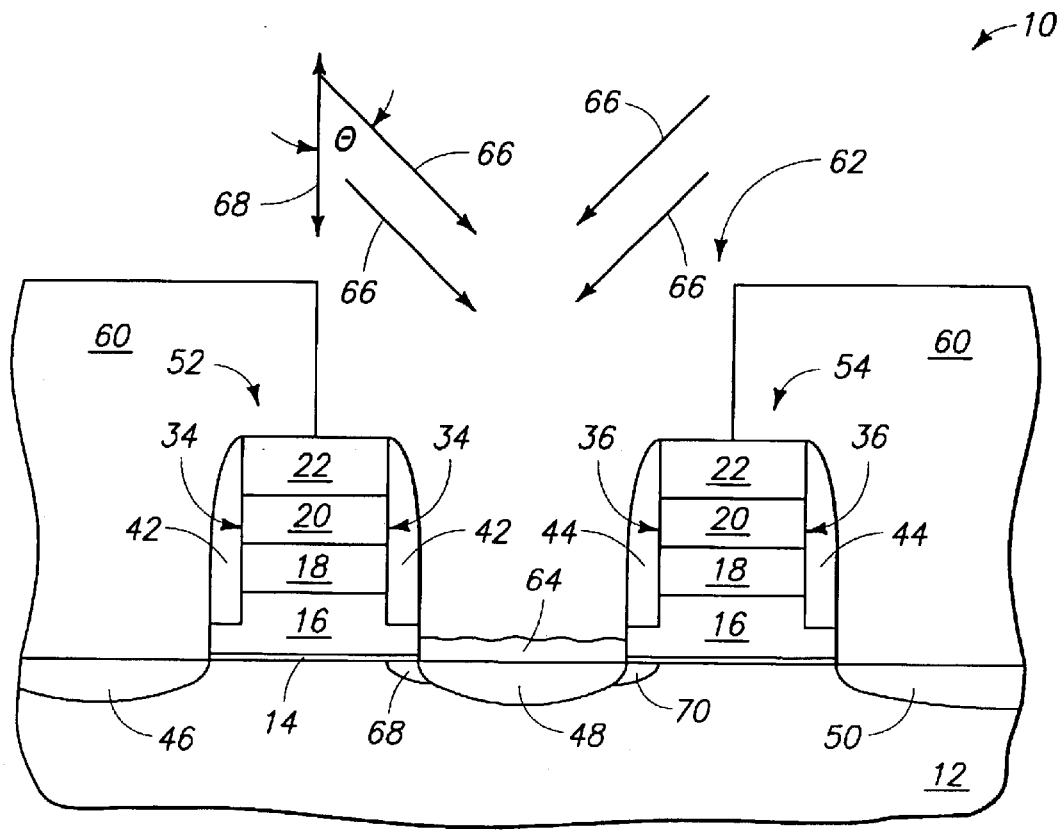
FIG. 5 is a view of the FIG. 1 fragment shown at a prior art processing stage subsequent to that of FIG. 4.
Figure 6:
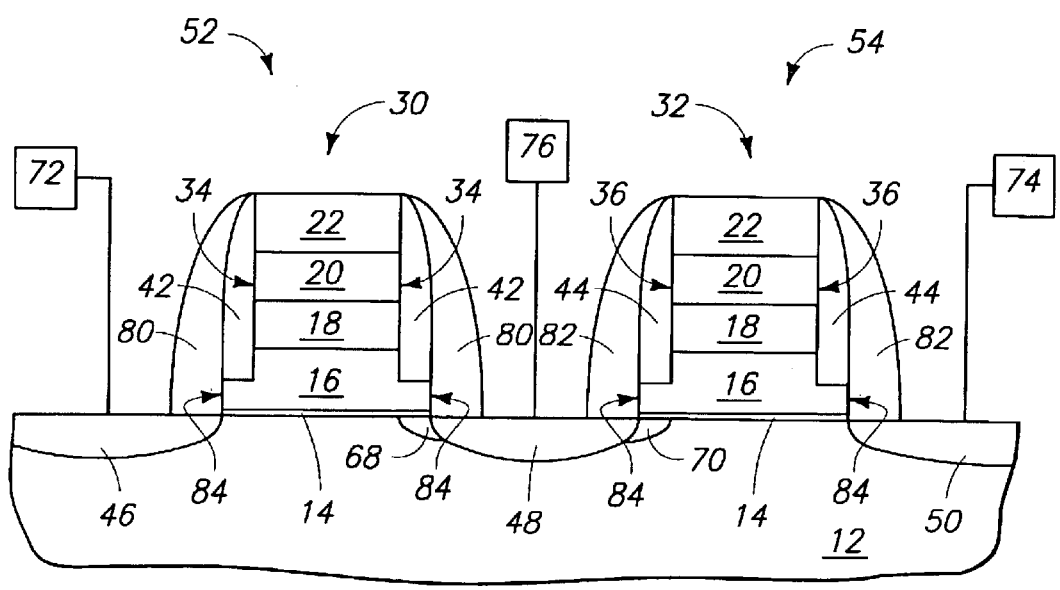
FIG. 6 is a view of the FIG. 1 fragment shown at a prior art processing stage subsequent to that of FIG. 5.

Referring initially to FIG. 7, the semiconductor wafer fragment 10 of FIG. 1 is shown at a processing stage subsequent to that of FIG. 2. Wafer fragment 10 comprises substrate 12, and layers 14, 16, 18, 20 and 22 described previously. Additionally, the etch described above with reference to FIG. 2 has been conducted to extend partially into layer 16. Such etch leaves a portion 100 of conductive material 16 extending between partially-formed transistor gates 30 and 32. Portion 100 can have a thickness "T" of, for example, from about 100 Angstroms to about 400 Angstroms, and typically has a thickness of about 200 Angstroms or about 250 Angstroms.

A masking material 102 is formed over partially-formed gates 30 and 32, and over conductive material 16. An opening 104 is formed to extend through masking material 102 and to a region between partially-formed gates 30 and 32. In particular aspects, masking material 102 can comprise, consist essentially of, or consist of photoresist, and the patterning to form opening 104 can comprise photolithographic processing.

The shown patterned mask 102 blocks portions of substrate 12 at locations 106 and 108, while not blocking a portion of substrate 12 at a location 110. Locations 106 and 108 correspond to locations where source/drain regions 46 and 50 (FIG. 4) will ultimately be formed, and location 110 corresponds to a location where shared source/drain region 48 (FIG. 4) will ultimately be formed.

One or more appropriate dopants 66 are angle implanted through opening 104 to form pocket implant regions 68 and 70 extending under partially-formed gates 30 and 32, respectively. Additionally, a dopant 67 is implanted into opening 104 to form $L_{DD}$ implant region 71. Dopant 67 can be implanted in any suitable sequence relative to dopant 66.

A difference between FIG. 7 and the prior art processing of FIGS. 3–6 is that the implant regions 68 and 70 of FIG. 7 (and $L_{DD}$ region 71) are formed while conductive material 16 extends between partially-formed gates 30 and 32, whereas the prior art processing removed the conductive material prior to formation of implant regions 68 and 70 (and the $L_{DD}$ implant region). The conductive material between partially-formed gates 30 and 32 of FIG. 7 (the shown portion 100 of the conductive material) advantageously reduces an aspect ratio of opening 104. Such can alleviate the problems described above with reference to FIG. 5. Specifically, such can alleviate, and even eliminate, formation of scum layer 64 within the opening, and accordingly can reduce variability that had occurred during prior art methodology for forming the $L_{DD}$ region and the pocket implant regions 68 and 70.

Referring to FIG. 8, mask 102 is removed and subsequently insulative material 40 is formed along sidewall edges of partially-formed transistor gates 30 and 32. It is noted that the one or both of the implants described above with reference to FIG. 7 can occur after formation of layer 40 rather than in the shown sequence of before such formation. However, it can be advantageous to conduct the implants before formation of layer 40 as the aspect ratio of the opening 104 is lower before formation of layer 40.

Referring to FIG. 9, insulative material 40 is anisotropically etched to form sidewall spacers 42 and 44, and subsequently conductive material 16 is etched to remove the portion 100 (FIG. 7) from between transistor gates 30 and 32 and thereby electrically isolate the transistor gates from one another.

Referring to FIG. 10, spacers 80 and 82 are formed, and subsequently an appropriate dopant is implanted to form heavily-doped regions 46, 48 and 50. Transistor gate 30, together with source/drain regions 46 and 48 forms a first transistor device 52; and transistor gate 32 together with source/drain regions 48 and 50 forms a second transistor device 54. Source/drain regions 46 and 50 can be electrically connected to data storage devices 72 and 74 (with exemplary data storage devices being capacitor constructions), and shared source/drain region 48 can be electrically connected to a bitline. Accordingly, transistor devices 52 and 54 can be incorporated into a pair of adjacent DRAM cells.

The processing of FIGS. 7–10 is similar to the prior art processing of FIGS. 1–6, except that the $L_{DD}$ implant and the implant of pocket regions 68 and 70 occur while conductive material 16 extends between transistor gates 30 and 32 in the processing of the present invention (FIG. 7), and occur after removal of conductive material 16 from between transistor gates 30 and 32 in the prior art processing of FIGS. 1–6. Accordingly, processing of the present invention is compatible with prior art processes, and can be accomplished utilizing the methodologies that had previously been utilized for the prior art processing. However, the implant of dopant 66 in processing of the present invention (i.e. the processing shown with reference to FIG. 7) would typically be conducted at a higher power than is the implant of dopant 66 in the prior art methodology (i.e. the processing of FIG. 5) in that the processing of the present invention implants dopant 66 through material 16, and the prior art processing does not. Similarly, the implant of dopant for the $L_{DD}$ regions in accordance with processing of the present invention can be at a higher power than is typically utilized for prior art methodologies. Methodology of the present invention can be easier to control for uniformity of $L_{DD}$ implants and pocket implants than was prior art methodology, and can lead to more uniform $L_{DD}$ implant regions and pocket implant regions than did prior art methodology.

It is to be understood that the processing sequence of FIGS. 7–10 is an exemplary sequence of methodology of the present invention, and that the invention can include other sequences. For instance, even though the heavily-doped source/drain regions are shown formed after patterning of gates 30 and 32, it is to be understood that the source/drain regions could also be provided prior to patterning of gates 30 and 32. If the heavily-doped source/drain regions are formed prior to formation of gates 30 and 32 (which can occur by, for example, forming the heavily-doped source/drain regions prior to formation of the gate stack over substrate 12), the source/drain regions can then also be formed prior to formation of pocket implant regions 68 and 70 and prior to formation of the $L_{DD}$ region. Additionally, it is to be understood that the source/drain region 48 could be formed at the processing step of FIG. 7, utilizing opening 104, and accordingly could be formed prior to removal of conductive material 100 from between gates 30 and 32. It can be advantageous, however, to form all of the heavily-doped source/drain regions 46, 48 and 50 after patterning of gates 30 and 32, in that the source/drain regions can then be formed in a single implant step, and can be "self-aligned" relative to the gates.

Figure 11:
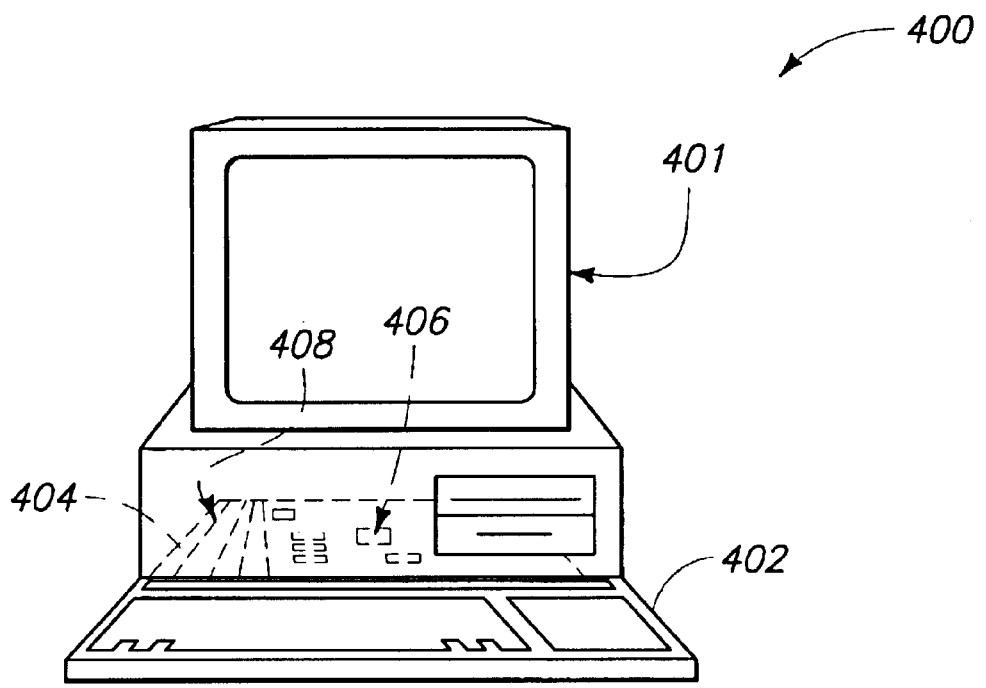
FIG. 11 is a diagrammatic view of a computer illustrating an exemplary application of the present invention.
Figure 12:
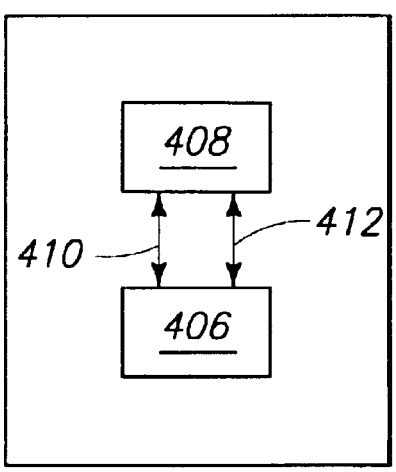
FIG. 12 is a block diagram showing particular features of the motherboard of the FIG. 12 computer.

FIG. 11 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM cells described with reference to FIG. 10. Memory device 408 can comprise an array of memory cells, and such array can be coupled with addressing circuitry for accessing individual memory cells in the array. Further, the memory cell array can be coupled to a read circuit for reading data from the memory cells. The, addressing and read circuitry can be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 13:
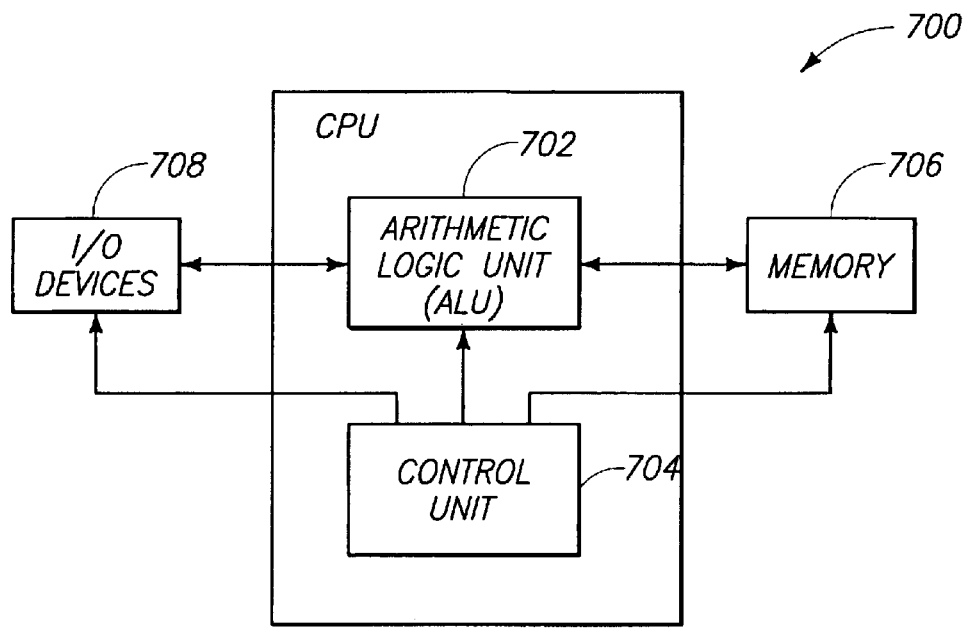
FIG. 13 is a high-level block diagram of an electronic system according to an exemplary aspect of the present invention.

FIG. 13 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 14:
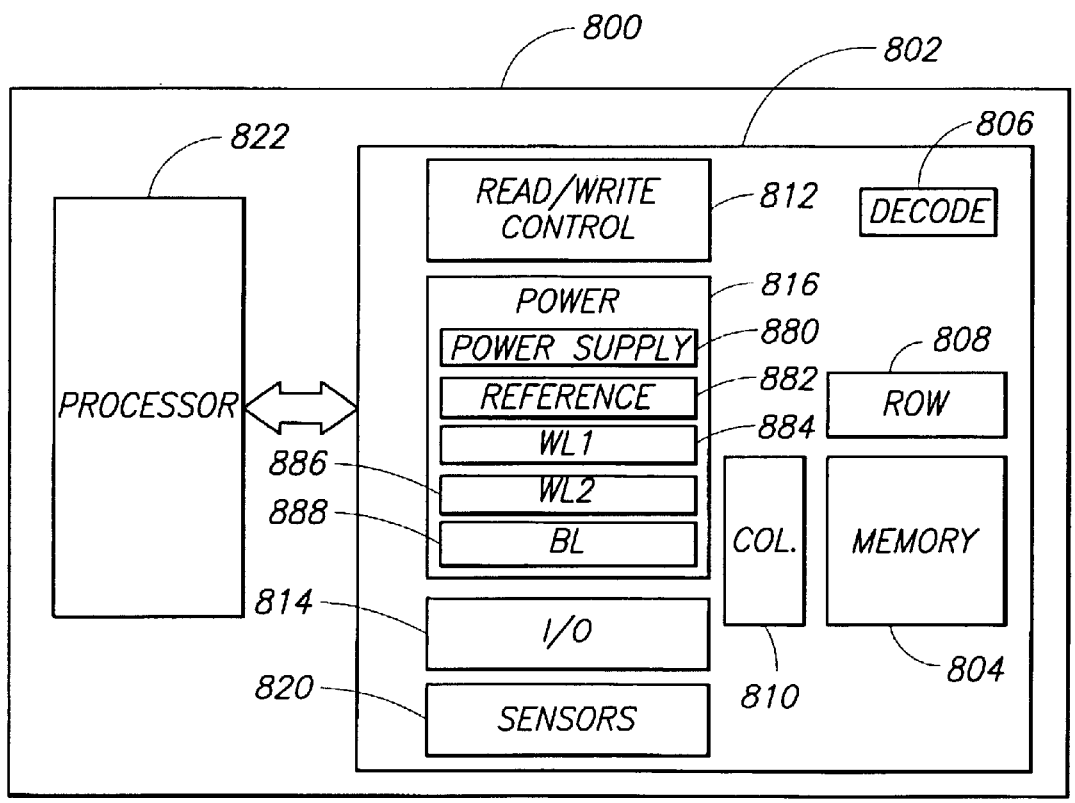
FIG. 14 is a simplified block diagram of an exemplary memory device according to an aspect of the present invention.

FIG. 14 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated-systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming conductively-doped regions relative to a pair of adjacent transistor gates, comprising:
   partially forming a pair of adjacent transistor gates over a semiconductor substrate, the partially-formed transistor gates having a layer of conductive material from the gate extending between them and joining the gates;
   forming at least one conductively-doped region between the partially-formed adjacent transistor gates; and
   after forming the at least one conductively-doped region, removing the layer of conductive material from between the adjacent transistor gates.

2. The method of claim 1 wherein at least one conductively-doped region includes a pair of regions extending to under the partially-formed adjacent transistor gates.

3. The method of claim 1 wherein the conductive material consists of conductively doped silicon.

4. The method of claim 1 wherein the conductive material consists of conductively doped silicon and has a thickness of from about 100 Å to about 400 Å.

5. The method of claim 1 wherein the at least one conductively-doped region comprises an $L_{DD}$ region.

6. The method of claim 1 wherein the at least one conductively-doped region includes a pair of pocket implant regions, and further comprising forming a heavily-doped source/drain region extending between the pocket implant regions and shared by the adjacent transistor gates.

7. The method of claim 1 wherein the at least one conductively-doped region includes a pair of pocket implant regions and an $L_{DD}$ region.

8. The method of claim 1 further comprising incorporating the adjacent transistor gates into a pair of adjacent DRAM cells, the adjacent cells sharing a bitline connection.

9. The method of claim 1 wherein the partially formed transistor gates have sidewall edges, and further comprising forming electrically insulative sidewall spacers along the sidewall edges of the partially formed transistor gates.

10. A method of forming angled implants relative to a pair of adjacent transistor gates, comprising:
    forming a gate stack over a substrate, the gate stack comprising a layer of electrically conductive material;
    etching only partially through the layer of electrically conductive material to leave an unetched remaining portion of the electrically conductive material and to partially form a pair of adjacent transistor gates from the gate stack;
    implanting at least one dopant at an angle other than 0° relative to vertical to form pocket implant regions under the partially formed adjacent transistor gates; and
    after the implanting, etching through the remaining portion of the electrically conductive material and completing formation of the pair of adjacent transistor gates.

11. The method of claim 10 wherein the partially formed transistor gates have sidewall edges, and further comprising forming electrically insulative sidewall spacers along the sidewall edges of partially formed transistor gates.

12. The method of claim 10 further comprising forming a heavily-doped source/drain region shared by the adjacent transistor gates; the forming the heavily-doped source/drain region occurring before the formation of the pocket regions.

13. The method of claim 10 further comprising forming a heavily-doped source/drain region shared by the adjacent transistor gates; the forming the heavily-doped source/drain region occurring after the formation of the pocket regions.

14. The method of claim 13 wherein the forming the heavily-doped source/drain region occurs prior to the etching through the remaining portion of the electrically conductive material.

15. The method of claim 13 wherein the forming the heavily-doped source/drain region occurs after the etching through the remaining portion of the electrically conductive material.

16. The method of claim 10 wherein the layer of electrically conductive material comprises conductively-doped silicon.

17. The method of claim 10 wherein the layer of electrically conductive material consists of conductively-doped silicon.

18. The method of claim 17 wherein the layer of electrically conductive material is a first layer of conductive material; and wherein the gate stack comprises:
    a pad oxide layer between the first layer of conductive material and the substrate;
    at least one more layer of conductive material over the first layer of conductive material; and
    an insulative layer over the at least one more layer of conductive material.

19. The method of claim 18 wherein the at least one more layer of electrically conductive material comprises a layer of tungsten over a layer of tungsten nitride.

20. The method of claim 18 wherein the insulative layer comprises silicon nitride.

21. A method of forming angled implants relative to a pair of adjacent transistor gates, comprising:
    forming a gate stack over a substrate, the gate stack comprising a first layer;

etching only partially through the first layer to leave an unetched remaining portion of the first layer and to partially form a pair of adjacent transistor gates from the gate stack, the partially formed transistor gates have sidewall edges;

forming a second layer along the sidewall edges of the partially formed pair of adjacent transistor gates;

after forming the second layer, implanting at least one dopant at an angle other than 0° relative to vertical to form pocket implant regions under the partially formed adjacent transistor gates; and after the implanting, etching through the remaining portion of the first layer and completing formation of the pair of adjacent transistor gates.

22. The method of claim 21 further comprising anisotropically etching the second layer prior to the etching of the remaining portion of the first layer.

23. The method of claim 21 wherein the first layer is an electrically conductive material.

24. The method of claim 21 wherein the first layer consists of conductively doped silicon.

25. The method of claim 21 wherein the second layer is an electrically insulated material.

26. The method of claim 21 wherein the second layer consists of silicon nitride.

27. The method of claim 21 wherein the first layer is an electrically conductive material and the second layer is an electrically insulative material.

28. The method of claim 21 wherein the first layer consists of conductively doped silicon and the second layer consists of silicon nitride.

29. A method of forming a DRAM assembly, comprising:

forming a gate stack over a substrate, the gate stack comprising a layer of electrically conductive material;

etching only partially through the layer of electrically conductive material to leave an unetched remaining portion of the electrically conductive material and to partially form a pair of adjacent transistor gates from the gate stack; one of the adjacent transistor gates ultimately being incorporated into a first DRAM cell and the other of the adjacent transistor gates ultimately being incorporated into a second DRAM cell;

forming pocket implant regions under the partially formed transistor gates;

after the forming the pocket implant regions, etching through the remaining portion of the electrically conductive material, and completing formation of the pair of adjacent transistor gates;

forming a heavily doped source/drain region shared by the adjacent transistor gates;

forming first and second data storage devices for the first and second DRAM cells, respectively; and forming a bitline contact in electrical with the source/drain region.

30. The method of claim 29 wherein the data storage devices are capacitors.

31. The method of claim 29 wherein the forming the heavily-doped source/drain region occurs before the formation of the pocket regions.

32. The method of claim 29 wherein the forming the heavily-doped source/drain region occurs after the formation of the pocket regions.

33. The method of claim 32 wherein the forming the heavily-doped source/drain region occurs prior to the etching through the remaining portion of the electrically conductive material.

34. The method of claim 32 wherein the forming the heavily-doped source/drain region occurs after the etching through the remaining portion of the electrically conductive material.

35. The method of claim 29 wherein the layer of electrically conductive material consists of conductively-doped silicon.

36. The method of claim 35 wherein the layer of electrically conductive material is a first layer of conductive material; and wherein the gate stack comprises:

a pad oxide layer between the first layer of conductive material and the substrate;

at least one more layer of conductive material over the first layer of conductive material; and an insulative layer over the at least one more layer of conductive material.

37. The method of claim 36 wherein the at least one more layer of electrically conductive material comprises a layer of tungsten over a layer of tungsten nitride.

38. The method of claim 36 wherein the insulative layer comprises silicon nitride.

39. A method of forming a pair of adjacent memory cells sharing a common bitline, comprising:

forming a gate stack over a substrate, the gate stack comprising a layer of electrically conductive material;

etching only partially through the layer of electrically conductive material to leave an unetched remaining portion of the electrically conductive material and to partially form a pair of adjacent transistor gates from the gate stack; one of the adjacent transistor gates ultimately being incorporated into a first transistor and the other of the adjacent transistor gates ultimately being incorporated into a second transistor;

defining three source/drain region locations relative to the partially formed transistor gates, a first of the source/drain region locations being associated with only the first transistor; a second of the source/drain region locations being shared by the first and second transistors, and a third of the source/drain region locations being associated with only the second transistor;

forming a mask over the first and third source/drain region locations;

while the mask is over the first and third source/drain region locations, implanting at least one dopant at an angle other than 0° relative to vertical to form pocket implant regions under the partially formed transistor gates;

after the implanting, removing the mask, etching through the remaining portion of the electrically conductive material, and completing formation of the pair of adjacent transistor gates;

forming first, second and third heavily doped source/drain regions at the first, second and third source/drain region locations, respectively;

forming first and second data storage devices in electrical connection with the first and third source/drain regions, respectively; and forming a bitline contact in electrical with the second source/drain region.

40. The method of claim 39 further comprising, while the mask is over the first and third source/drain region locations, implanting at least one dopant to form an $L_{DD}$ region between the partially formed transistor gates.

41. The method of claim 39 wherein the data storage devices are capacitors.

42. The method of claim 39 wherein the forming the heavily-doped source/drain regions occurs before the formation of the pocket regions.

43. The method of claim 39 wherein the forming the heavily-doped source/drain regions occurs after the formation of the pocket regions.

44. The method of claim 43 wherein the forming the heavily-doped source/drain regions occurs prior to the etching through the remaining portion of the electrically conductive material.

45. The method of claim 43 wherein the forming the heavily-doped source/drain regions occurs after the etching through the remaining portion of the electrically conductive material.

46. The method of claim 39 wherein the layer of electrically conductive material comprises conductively-doped silicon.

47. The method of claim 39 wherein the layer of electrically conductive material comprises conductively-doped silicon.

48. The method of claim 47 wherein the layer of electrically conductive material is a first layer of conductive material; and wherein the gate stack comprises:
   a pad oxide layer between the first layer of conductive material and the substrate;
   at least one more layer of conductive material over the first layer of conductive material; and
   an insulative layer over the at least one more layer of conductive material.

49. The method of claim 48 wherein the at least one more layer of electrically conductive material comprises a layer of tungsten over a layer of tungsten nitride.

50. The method of claim 48 wherein the insulative layer comprises silicon nitride.

51. A method of forming an electronic system, comprising:
   forming a gate stack over a substrate, the gate stack comprising a layer of electrically conductive material;
   etching only partially through the layer of electrically conductive material to leave an unetched remaining portion of the electrically conductive material and partially forming transistor gates from the gate stack; at least some of the partially formed transistor gates being paired adjacent transistor gates;
   forming pocket implant regions under at least some of the partially formed paired adjacent transistor gates;
   after the forming the pocket implants, etching through the remaining portion of the electrically conductive material, and completing formation of the transistor gates;
   forming source/drain regions proximate the transistor gates, some of the source/drain regions being shared by paired adjacent transistor gates;
   forming data storage devices in electrical connection with at least some of the source/drain regions;
   forming bitline contacts in electrical with at least some of the shared source/drain regions; the data storage devices, paired adjacent transistors and bitline contacts being incorporated into an array of memory cells;
   forming addressing circuitry coupled to the array of memory cells for accessing individual memory cells in the array of memory cells; and
   forming a read circuit coupled to the array of memory cells for reading data from memory cells in the array of memory cells.

52. The method of claim 51 wherein the memory cells are incorporated into devices selected from the group consisting of SDRAM, DDR SDRAM, SLDRAM, Direct RDRAM, SRAM, VRAM, EEPROM, and Flash memories.

53. The method of claim 51 wherein the data storage devices are capacitors.

54. The method of claim 51 wherein the forming the heavily-doped source/drain regions occurs before the formation of the pocket regions.

55. The method of claim 51 wherein the forming the heavily-doped source/drain regions occurs after the formation of the pocket regions.

56. The method of claim 55 wherein the forming the heavily-doped source/drain regions occurs prior to the etching through the remaining portion of the electrically conductive material.

57. The method of claim 55 wherein the forming the heavily-doped source/drain regions occurs after the etching through the remaining portion of the electrically conductive material.

58. The method of claim 51 wherein the layer of electrically conductive material consists of conductively doped silicon.

59. The method of claim 58 wherein the layer of electrically conductive material is a first layer of conductive material; and wherein the gate stack comprises:
   a pad oxide layer between the first layer of conductive material and the substrate;
   at least one more layer of conductive material over the first layer of conductive material; and
   an insulative layer over the at least one more layer of conductive material.

60. The method of claim 59 wherein the at least one more layer of electrically conductive material comprises a layer of tungsten over a layer of tungsten nitride.

61. The method of claim 59 wherein the insulative layer comprises silicon nitride.

* * * * *

UNITED STATES PATENT AND TRADEMARK OFFICE
CERTIFICATE OF CORRECTION

PATENT NO. : 6,723,623 B1  
APPLICATION NO. : 10/326725  
DATED : April 20, 2005  
INVENTOR(S) : Phong Nguyen Page 1 of 1

It is certified that error appears in the above-identified patent and that said Letters Patent is hereby corrected as shown below:

Col. 3, line 60 after "to" please replace "shown" with --show--.

Col. 4, line 18, please insert --be-- before "formed".

Col. 11, line 53, claim 29, please insert --contact-- after "electrical".

Col. 12, line 59, claim 39, please insert --contact-- after "electrical".

Col. 13, line 19, claim 47, after "material" please replace "comprises" with --consists of--.

Col. 14, line 3, claim 51, please insert --contact-- after "electrical".

Signed and Sealed this

Fifteenth Day of August, 2006

JON W. DUDAS  
*Director of the United States Patent and Trademark Office*

UNITED STATES PATENT AND TRADEMARK OFFICE
CERTIFICATE OF CORRECTION

| | |
|---|---|
| PATENT NO. | : 6,723,623 B1 |
| APPLICATION NO. | : 10/326725 |
| DATED | : April 20, 2004 |
| INVENTOR(S) | : Phong Nguyen |

Page 1 of 1

It is certified that error appears in the above-identified patent and that said Letters Patent is hereby corrected as shown below:

Col. 3. line 60 after "to" please replace "shown" with --show--.

Col. 4, line 18, please insert --be-- before "formed".

Col. 11, line 53, claim 29, please insert --contact-- after "electrical".

Col. 12, line 59, claim 39, please insert --contact-- after "electrical".

Col. 13, line 19, claim 47, after "material" please replace "comprises" with --consists of--.

Col. 14, line 3, claim 51, please insert --contact-- after "electrical".

This certificate supersedes Certificate of Correction issued August 15, 2006.

Signed and Sealed this

Nineteenth Day of September, 2006

JON W. DUDAS
*Director of the United States Patent and Trademark Office*